(12) United States Patent
Tanaka et al.

(10) Patent No.: US 8,394,577 B2
(45) Date of Patent: Mar. 12, 2013

(54) PATTERNING PROCESS

(75) Inventors: Akinobu Tanaka, Joetsu (JP); Tamotsu Watanabe, Joetsu (JP); Satoshi Watanabe, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 175 days.

(21) Appl. No.: 12/756,587

(22) Filed: Apr. 8, 2010

(65) Prior Publication Data
US 2010/0261123 A1    Oct. 14, 2010

(30) Foreign Application Priority Data
Apr. 8, 2009 (JP) ................... 2009-093719

(51) Int. Cl.
*G03F 7/26* (2006.01)
(52) U.S. Cl. ............. 430/322; 430/270.1; 430/330
(58) Field of Classification Search .................. 430/311, 430/322, 330, 270.1
See application file for complete search history.

(56) References Cited

U.S. PATENT DOCUMENTS

| | | | |
|---|---|---|---|
| 5,714,625 A | 2/1998 | Hada et al. | |
| 5,945,250 A | 8/1999 | Aoai et al. | |
| 6,004,724 A | 12/1999 | Yamato et al. | |
| 6,063,953 A | 5/2000 | Hada et al. | |
| 6,114,086 A | 9/2000 | Kobayashi et al. | |
| 6,261,738 B1 | 7/2001 | Asakura et al. | |
| 6,511,785 B1 | 1/2003 | Takemura et al. | |
| 6,512,020 B1 | 1/2003 | Asakura et al. | |
| 6,537,718 B2 | 3/2003 | Nishiyama et al. | |
| 6,861,198 B2 | 3/2005 | Takeda et al. | |
| 7,419,771 B2 * | 9/2008 | Ho et al. | 430/322 |
| 7,569,326 B2 | 8/2009 | Ohsawa et al. | |
| 2005/0095532 A1 | 5/2005 | Kodama et al. | |
| 2006/0154171 A1 | 7/2006 | Hirayama et al. | |
| 2006/0166133 A1 | 7/2006 | Koitabashi et al. | |
| 2007/0105042 A1 | 5/2007 | Takeda et al. | |
| 2007/0128555 A1 | 6/2007 | Harada et al. | |
| 2007/0160929 A1 | 7/2007 | Hasegawa et al. | |
| 2007/0190458 A1 | 8/2007 | Nakashima et al. | |
| 2008/0096128 A1 | 4/2008 | Takeda et al. | |
| 2010/0020297 A1 | 1/2010 | Inatomi | |

FOREIGN PATENT DOCUMENTS

| | | |
|---|---|---|
| EP | 1645908 A1 | 4/2006 |
| EP | 1684118 A1 | 7/2006 |
| JP | 7-84359 A | 3/1995 |
| JP | 9-95479 A | 4/1997 |
| JP | 9-208554 A | 8/1997 |
| JP | 9-230588 A | 9/1997 |
| JP | 9-301948 A | 11/1997 |
| JP | 9-325497 A | 12/1997 |
| JP | 2906999 B2 | 6/1999 |
| JP | 2000-267269 A | 9/2000 |
| JP | 2000-314956 A | 11/2000 |
| JP | 2001-142199 A | 5/2001 |
| JP | 2001-183837 A | 7/2001 |
| JP | 2003-233185 A | 8/2003 |
| JP | 2005-19969 A | 1/2005 |
| JP | 2006-145775 A | 6/2006 |
| JP | 2006-201532 A | 8/2006 |
| JP | 2007-132998 A | 5/2007 |
| JP | 2007-182488 A | 7/2007 |
| JP | 2007-212941 A | 8/2007 |
| JP | 2008-133448 A | 6/2008 |
| JP | 2009-69814 A | 4/2009 |
| WO | 01/80292 A1 | 10/2001 |

OTHER PUBLICATIONS

European Search Report dated Aug. 20, 2010, issued in corresponding European Patent Application No. 10250725.8.
Japanese Office Action dated Jul. 11, 2012, issued in corresponding Japanese Patent Application No. 2009-093719 (3 pages).

* cited by examiner

*Primary Examiner* — Kathleen Duda
*Assistant Examiner* — Caleen Sullivan
(74) *Attorney, Agent, or Firm* — Westerman, Hattori, Daniels & Adrian, LLP

(57) ABSTRACT

In a chemically amplified resist composition comprising a base resin, an acid generator, and a solvent, 1,400-5,000 pbw of the solvent is present per 100 pbw of the base resin, and the solvent comprises at least 60 wt % of PGMEA and ethyl lactate, and 0.2-20 wt % of a high-boiling solvent. A resist pattern is formed by coating the resist composition on a substrate, prebaking, patternwise exposure, post-exposure baking, development, and heat treatment.

11 Claims, No Drawings

PATTERNING PROCESS

CROSS-REFERENCE TO RELATED APPLICATION

This non-provisional application claims priority under 35 U.S.C. §119(a) on Patent Application No. 2009-093719 filed in Japan on Apr. 8, 2009, the entire contents of which are hereby incorporated by reference.

TECHNICAL FIELD

This invention relates to a patterning process using a chemically amplified resist composition for providing improved line edge roughness (LER) and high resolution.

BACKGROUND ART

A number of efforts are currently made to achieve a finer pattern rule in the drive for higher integration and operating speeds in LSI devices. Deep-ultraviolet lithography using KrF or ArF excimer laser has become the main stream of microfabrication technology. The deep-UV lithography combined with chemically amplified resist is capable of patterning to a feature size of 0.2 μm or less while pattern processing to a feature size of less than 0.065 μm now becomes the target. Also in the electron beam (EB) lithography, the progress of chemically amplified resist has reached a practically acceptable sensitivity to EB of higher energy, indicating possible processing to a finer size. Further in the lithography using EUV, use of chemically amplified resist is thought essential to achieve a practically acceptable sensitivity.

In the course of development of such chemically amplified positive resist compositions, the addition and modification of various resist components have been proposed in order to ameliorate the outstanding problems of resolution, sensitivity, pattern profile, post-exposure delay (PED, a change of pattern profile with standing time following exposure) and substrate dependency. Among others, the solvent is an important component to impart a uniform coating capability to coating compositions including chemically amplified resist compositions. A variety of solvents have been proposed to enable effective resist coating. An ability to form a uniform coating is indispensable to improve line edge roughness (LER) and resolution. To attain the goals of homogeneous dissolution of resist components and deposition of a uniform coating at the same time, a mixture of solvents is generally used rather than individual solvents.

One exemplary solvent mixture is proposed in JP-A 2000-267269 as comprising propylene glycol monoalkyl ether acetate and propylene glycol monoalkyl ether. This solvent mixture is useful in inhibiting formation of defects in the resist film and becomes effective when a proportion of propylene glycol monoalkyl ether exceeds 50% by weight based on the total solvent weight.

Another solvent mixture which is effective for improving LER is proposed in JP-A 2001-183837 as comprising propylene glycol monoalkyl ether acetate, propylene glycol monoalkyl ether and optionally, γ-butyrolactone. Allegedly a choice of this solvent mixture overcomes the problem of micro-grains (granular foreign matter of 100 μm or smaller) during development.

A further solvent mixture which provides a resist composition with storage stability and a good pattern profile is proposed in JP-A H07-084359 as comprising propylene glycol monoalkyl ether acetate, propylene glycol monoalkyl ether, and ethyl lactate. The solvent mixture becomes effective when a proportion of ethyl lactate is 30 to 90% by weight based on the total solvent weight.

In the foregoing proposals, line edge roughness (LER) is improved by a modification of the chemically amplified positive resist composition. LER may also be improved by a modification of the pattern forming process. The method of JP-A 2005-19969, for example, intends to improve LER by feeding a solvent gas to a resist pattern resulting from development for dissolving the resist surface and then effecting heat treatment to evaporate off the solvent and to sinter the resist film. This method, however, is undesirable in that a unit for feeding a solvent gas to the resist pattern after development and a unit for recovering the solvent must be added to the developing system, and so the overall system becomes costly.

CITATION LIST

Patent Document 1: JP-A 2000-267269
Patent Document 2: JP-A 2001-183837
Patent Document 3: JP-A H07-084359
Patent Document 4: JP-A 2005-19969
Patent Document 5: WO 2001/080292
Patent Document 6: JP-A 2001-142199
Patent Document 7: JP-A 2007-182488 (US 2007160929)
Patent Document 8: JP-A 2007-212941 (US 2007190458)
Patent Document 9: JP-A 2006-201532 (US 20060166133, EP 1684118, CN 1825206)
Patent Document 10: JP-A 2003-233185 (U.S. Pat. No. 6,861,198)
Patent Document 11: JP-A 2006-145775
Patent Document 12: JP-A H09-325497
Patent Document 13: JP-A 2008-133448 (U.S. Pat. No. 7,569,326)

SUMMARY OF INVENTION

The recent drive for higher integration of integrated circuits trends toward miniaturizing the resist pattern to a feature size of 50 nm or less. An attempt to achieve such a fine feature size, if the thickness of a resist film is kept unchanged from the prior art, results in a resist pattern which has too high an "aspect ratio" (film thickness/feature width) to withstand deformation during development and eventually collapses. For this reason, the miniaturization entails a thickness reduction of the resist film. In an attempt to form a pattern with a feature size of 50 nm or less, for example, the thickness of a resist film must be reduced to 150 nm or less. In the case of multilayer lithography, an attempt was made to form a fine size pattern using a resist film having a thickness of 10 nm to 100 nm, as reported in WO 2001080292.

In an attempt to form a resist pattern with a finer size using a resist film having a reduced thickness, line edge roughness (LER) becomes a more serious problem as the pattern feature size is reduced. The problem remains unsolved even when well-known improved solvent systems including those of JP-A 2001-183837 are used, particularly in an attempt to form a pattern with a feature size of 50 nm or less.

It is believed that LER is caused by enlargement of the size of micro-domains created in a resist film upon coating and heterogeneous reaction due to non-uniform distribution of acid generator and other components in a resist film. The inventors confirmed that the domain size is enlarged particularly when the resist film thickness is reduced with a goal to reduce the pattern feature size. The non-uniform distribution of components in a resist film becomes more prominent as the resist film thickness is reduced.

Besides the above-discussed problems, another problem arises with an EB resist material for use in the preparation of photomasks. When photomasks are prepared by spin coating an EB resist material, the rotational speed and other parameters of the spin coating method are limited because photomask blank substrates having a substantial weight are used. If a resist composition based on a conventional solvent system is used, it may not be effectively coated. There arises a problem of severer LER than in the case of pattern formation on semiconductor wafers.

An object of the invention is to provide a patterning process using a chemically amplified resist composition which is applicable to form a resist film having a thickness of up to 150 nm to be processed by photolithography for micropatterning, especially lithography using a light source such as a KrF laser, ArF laser, $F_2$ laser, EUV, EB or x-ray, the process offering the advantages of improved LER and satisfactory pattern profile.

The inventors have found that a resist composition which is formulated using a high-boiling solvent in addition to an ordinary solvent can form a uniform resist film even when the film is thin, and that heat treatment of a resist pattern after development is effective in improving the resolution and LER of the resist pattern.

More particularly, the invention relates to a pattern forming process using a chemically amplified resist composition, wherein the high-boiling solvent remains in the resist film after pattern formation and effects uniformization of roughness on the pattern surface when the resist film is sintered by the post-development heat treatment.

Accordingly, in a first aspect, the invention provides a process for forming a pattern, comprising the steps of coating a chemically amplified resist composition on a processable substrate, prebaking the coating to remove any excess solvent therein to form a resist film, exposing patternwise the resist film to high-energy radiation, optionally post-exposure baking, developing the exposed resist film with a developer, and heat treating to form a resist pattern. The chemically amplified resist composition comprises a base resin, an acid generator, and a solvent, wherein the resist film of the composition changes its solubility in the developer under the action of an acid generated by the acid generator upon exposure to high-energy radiation. The solvent is present in a total amount of 1,400 to 5,000 parts by weight per 100 parts by weight of the base resin. The solvent comprises propylene glycol monomethyl ether acetate (PGMEA) and ethyl lactate (EL) which are present in a total amount of at least 60% by weight of the total solvent weight. The solvent further comprises at least one solvent (referred to as "high-boiling solvent," hereinafter) selected from the group consisting of γ-butyrolactone, alkyl acetoacetate, dipropylene glycol methyl ether acetate, dipropylene glycol butyl ether, tripropylene glycol butyl ether, ethylene carbonate, and propylene carbonate, in a proportion of 0.2% to 20% by weight of the total solvent weight.

This resist composition ensures that a resist pattern with minimized LER is formed from a resist film having a thickness equal to or less than 150 nm through development and subsequent heat treatment.

In a preferred embodiment, the post-development heat treatment is at a temperature which is equal to or higher than the temperatures of the prebaking and post-exposure baking steps and which does not cause a change of at least 10% to a line width of the pattern. More specifically, the post-development heat treatment is effected at an optimum temperature of 90 to 190° C. for 1 to 15 minutes.

In a preferred embodiment, a weight proportion of PGMEA relative to the total solvent weight is higher than a weight proportion of any other solvent relative to the total solvent weight, and a weight proportion of EL is 10% to 40% by weight of the total solvent weight. The solvent mixture in the range forms a resist composition which is storage stable and effective in forming a pattern with minimal edge roughness after development.

In a preferred embodiment, the solvent further comprises propylene glycol monomethyl ether (PGME) in an amount of 10 to 40% by weight of the total solvent weight.

Another embodiment is a process for forming a pattern, comprising the steps of coating the chemically amplified resist composition on a processable substrate, prebaking the coating to remove any excess solvent therein to form a resist film, exposing patternwise the resist film to high-energy radiation, optionally post-exposure baking, developing the exposed resist film with a developer, and heat treating to form a resist pattern, the resist composition comprising (A-1) a base resin having acid labile group-protected acidic functional groups which is alkali insoluble or substantially alkali insoluble, but becomes alkali soluble when the acid labile groups are eliminated, (B) the acid generator, and (C) a nitrogen-containing compound serving as a base, the resist composition being positive working.

In one embodiment, components (A-1) and (B) may be combined together into an integral polymer.

A further embodiment is a process for forming a pattern, comprising the steps of coating the chemically amplified resist composition on a processable substrate, prebaking the coating to remove any excess solvent therein to form a resist film, exposing patternwise the resist film to high-energy radiation, optionally post-exposure baking, developing the exposed resist film with a developer, and heat treating to form a resist pattern, the resist composition comprising (A-2) a base resin which is alkali soluble, but becomes alkali insoluble in the presence of an acid catalyst and/or a combination of a crosslinker and a base resin which is alkali soluble, but becomes alkali insoluble through reaction with the crosslinker in the presence of an acid catalyst, (B) the acid generator, and (C) a nitrogen-containing compound serving as a base, the resist composition being negative working.

In one embodiment, components (A-2) and (B) may be combined together into an integral polymer.

In a preferred embodiment, the resist film resulting from the film forming step has a thickness of 10 nm to 150 nm, more preferably 10 nm to 100 nm. The patterning process of the invention solves the problem that larger size domains are likely to form when a resist film formed is thin, i.e., has a thickness equal to or less than 150 nm, especially equal to or less than 100 nm. Since the high-boiling solvent remains within the resist film even after the excess solvent is removed by prebaking, the resist film is free of large domains having a diameter of at least 50 Å. When the high-boiling solvent is evaporated off from the resist surface during the post-development heat treatment, it effects uniformization of roughness on the resist surface. Then a satisfactory resist pattern with minimized LER is available.

In a preferred embodiment, the resist pattern resulting from the developing step has a minimum line width of up to 50 nm. When a pattern having a minimum line width of 50 nm is to be formed, the thickness of a resist film must be reduced below the conventional thickness, affording a likelihood for larger size domains to form so that LER has a more detrimental impact on the resist pattern, giving rise to a problem of significance. The embodiment overcomes this problem.

In a preferred embodiment, the processable substrate is a photomask blank. When the resist composition is coated onto a processable substrate in the form of a photomask blank to form a resist film thereon, the coating method is limited because the processable substrate is not a disc which is advantageously rotatable, and larger size domains are thus likely to form. This problem is solved by the pattern forming process of the invention.

ADVANTAGEOUS EFFECTS OF INVENTION

The resist composition is formulated using a solvent mixture containing specific amounts of PGMEA, EL and at least one high-boiling solvent selected from the group consisting of γ-butyrolactone, alkyl acetoacetate, dipropylene glycol methyl ether acetate, dipropylene glycol butyl ether, tripropylene glycol butyl ether, ethylene carbonate, and propylene carbonate. The pattern forming process using this resist composition has the advantages including formation of a uniform resist film from the composition and improved LER due to sintering during post-development heat treatment.

DESCRIPTION OF EMBODIMENTS

A process of forming a fine size resist pattern, especially in the preparation of a mask blank having a pattern rule equal to or less than 50 nm involves the steps of resist film formation, electron beam exposure, optional heat treatment and development with a developer. Since a prior art resist composition is difficult to form a fully uniform resist film, the resultant pattern may have an increased LER, indicating that even if the pattern itself can be resolved, the result is substantially meaningless.

In search for a pattern forming process which can form a uniform resist film and process it into a pattern of a satisfactory profile with improved LER, the inventors have found that a solvent mixture of at least three specific solvents selected from numerous solvents ensures that a thin resist film having a minimized domain size is formed from a resist composition prepared using this solvent mixture and that additional heat treatment of the resist pattern after development results in a pattern having minimized LER. The present invention is predicated on this finding. The patterning process of the invention overcomes the above-discussed problems and achieves significant improvements in resolution and subsequent transfer performance.

Several embodiments of the invention are described below by way of illustration while the invention is not limited thereto.

In our experiment to evaluate a resist composition for use in a photomask manufacturing process, a resist composition was prepared using a 1/1 solvent mixture of propylene glycol monomethyl ether acetate (PGMEA) and propylene glycol monomethyl ether (PGME) (both belonging to commonly used solvents) as described in Patent Document 1. The resist composition was applied onto a photomask blank to form a resist film. Since the experiment intended to achieve a finer pattern size, the thickness of a resist film was reduced below the commonly used level. Specifically the resist composition was coated onto a blank substrate to a thickness of 150 nm. Increased variations of in-plane film thickness were observed although such an increase was not found in an ordinary attempt to form a resist film of 300 nm thick. Specifically, the in-plane film thickness range (i.e., the difference between minimum and maximum of film thickness) was more than 8.0 nm relative to the target of 5.0 nm or less. After patternwise writing of this thin resist film with electron beam, the in-plane variation of pattern feature size was increased as well. The pattern had an accordingly increased value of LER, which was also a problem.

In another experiment wherein a resist composition was prepared using a 1/1 solvent mixture of propylene glycol monomethyl ether acetate (PGMEA) and ethyl lactate (EL) as described in Patent Document 2, the in-plane film thickness range was within the target value. A pattern with a fine size of 50 nm could be formed. This pattern had an acceptable value of LER.

To find the cause accounting for the difference between these experiments, the surface state of the coated films was observed under an atomic force microscope (AFM) for comparison. For the PGMEA/EL solvent mixture, a smaller domain size on the resist surface was confirmed. From this result, a possibility was deduced that the difference in evaporation rate between solvents has an impact on the uniform distribution of components in a resist film.

It is believed that the reason why a problem of LER arises as the film thickness is further reduced can be similarly illuminated. Then resist films having a thickness of 160 nm and 80 nm were formed, and their surface state was observed under AFM for comparison. It was found that the domain size increases as the film thickness becomes thinner. It is presumed that this domain size increase is the cause of compromising LER.

The inventors presumed that the cause for the above-discussed problems is as follows. To form a resist film of up to 150 nm by spin coating, the concentration of resist components must be reduced (by increasing the amount of solvent) as compared with the conventional composition. Particularly in the case of photomask blanks, it is difficult to increase the rotational speed of spin coating beyond 3,000 rpm due to limitations associated with the shape, weight and other factors of substrates, which necessitates to use a dilute composition. Such a resist composition diluted to a low concentration has a possibility that owing to solvent evaporation continuing from the coating step to the prebaking step, a non-uniform distribution of components within a film manifests more distinctly at the same time as a variation of film thickness. It is believed that this non-uniform distribution of components causes to increase LER. More specifically, it is believed that what accounts for the empirical result that the in-plane film thickness variation was suppressed to 3.0 nm or less when a resist composition using a 1/1 solvent mixture of PGMEA and EL was coated onto a photomask blank substrate to a thickness of 150 nm, but the variation increased to about 8.0 nm when EL was replaced by PGME is the boiling point of these solvents. It is presumed that EL due to its high boiling point (154° C.) has a slower evaporation rate than PGME (121° C.) so that EL is effective in suppressing the in-plane variation of film thickness.

On the other hand, ethyl lactate (EL) is notorious for its negative impact on the storage stability of a resist composition. For example, if a chemically amplified resist composition containing at least 50% by weight of EL based on the total solvent weight is allowed to stand in an air-unshielded atmosphere at room temperature for one month, there arises a practical problem that it is difficult to suppress a change of its sensitivity within the acceptable range of 5%. It is then believed essential for the desired storage stability that the proportion of EL be reduced to or below 40% by weight based on the total solvent weight. Then replacement of a part of EL by PGME is thought to offer the simplest means for solving the above-discussed problem and the storage stability problem. In an actual trial, however, the partial replacement of EL by PGME entailed a decline of performance. In particular, an apparent increase of LER was observed when the film thickness was reduced to or below 100 nm as one of severer conditions.

The above consideration suggests that the control of solvent boiling point is crucial to solve the problems of film thickness variations and LER increases encountered during formation of a film having a thickness of up to 150 nm. However, it is known that a pattern of an acceptable profile is not achievable when high boiling solvents such as diethylene glycol solvents are used as the major solvent.

Then, among solvent systems of PGMEA combined with EL, the inventors selected a solvent mixture in which a proportion of EL is reduced to or below 40% by weight based on the total solvent weight for the purpose of storage stability, and a high-boiling solvent is added. This combination has been found to succeed in minimizing the in-plane variation of film thickness. It has also been found that a resist pattern resulting from a resist composition using this solvent system is also improved in LER due to post-development heat treatment. Although the pattern is likely to have increased LER at a reduced film thickness of 100 nm or less as previously described, the addition of a high boiling solvent is effective for suppressing the in-plane variation of film thickness even at such reduced thickness, and also post-development heat treatment contributes to a further improvement in LER.

Involved in the pattern forming process of the invention is post-development heat treatment. During this heat treatment, the high-boiling solvent remaining in the resist pattern after development evaporates from the resist surface, creating microscopic thermal flow to mitigate roughness. The microscopic thermal flow serves to mitigate the LER of a pattern without impairing its profile.

The pattern forming process of the invention has the advantage that the existing development system may be used as such without adding any special unit, as compared with the prior art process involving exposure of the pattern as developed to a solvent gas. In general, the development system used herein includes two or more hot plates for baking and a development unit wherein following exposure, the resist film is heat treated (post-exposure baked) on the first hot plate, developed in the development unit, and then heat treated (post-development baked) on the second hot plate.

The post-development heat treatment is preferably at a temperature which is higher than the prebaking temperature or the post-exposure baking (PEB) temperature and lower than the incipient degradation temperature of the resist film. The degradation temperature of a resist film is generally in the range of 140° C. to 190° C. although it varies with a particular chemically amplified resist composition. Since the basic function of post-development heat treatment is to improve the edge roughness of a resist pattern while maintaining the width and profile thereof, a change of pattern line width by heat treatment should preferably be less than 10%, more preferably up to 5%. In this regard, the invention is distinguishable from the so-called thermal flow method (e.g., Patent Document 6) of forming a pattern of a polymer and heating the polymer above its fluidizing temperature for shrinkage of pattern line width or hole diameter.

In addition to the solvent mixture described above, the resist composition used in the pattern forming process comprises a base polymer, an acid generator, and a nitrogen-containing compound as a basic component. With respect to these components, reference may be made to prior art well-known high-resolution resist compositions. Appropriate amounts may be determined as solids relative to the solvent mixture.

The solvent mixture as used herein is described in further detail.

The solvent (mixture) that constitutes the resist composition contains propylene glycol monomethyl ether acetate (PGMEA) and ethyl lactate (EL) and further contains at least one third solvent selected from the group consisting of γ-butyrolactone, alkyl acetoacetate (preferably of straight or branched $C_1$-$C_4$ alkyl), dipropylene glycol methyl ether acetate, dipropylene glycol butyl ether, tripropylene glycol butyl ether, ethylene carbonate, and propylene carbonate.

The third solvent which is added to the PGMEA/EL system is selected from the group consisting of γ-butyrolactone, alkyl acetoacetate, dipropylene glycol methyl ether acetate, dipropylene glycol butyl ether, tripropylene glycol butyl ether, ethylene carbonate, and propylene carbonate, and combinations thereof. Among others, those solvents having a boiling point of at least 200° C., i.e., γ-butyrolactone, dipropylene glycol methyl ether acetate, tripropylene glycol butyl ether, dipropylene glycol butyl ether, ethylene carbonate, and propylene carbonate are more effective in forming a uniform coating film and improving LER, with dipropylene glycol butyl ether, tripropylene glycol butyl ether, and dipropylene glycol methyl ether acetate being even more preferred.

The proportions of the foregoing solvents must be individually adjusted in accordance with a choice of resist components other than the solvents, the desired thickness of a resist film, and the like. To insure the desired storage stability, it is preferred that a proportion of PGMEA in the mixture be the highest among the solvents.

To insure a solubility of other components, typically acid generator, in the solvent mixture and hence, a uniform distribution thereof in a film and to provide a spin coating amenability, a proportion of EL should be in the range from 10% to 40% by weight based on the total solvent weight. Less than 10 wt % of EL may give rise to problems with respect to acid generator solubility and coating property. Even at an EL proportion of less than 10 wt %, a uniform film can sometimes be formed by a careful choice of coating parameters, but a complex recipe is necessary therefor. With EL in excess of 40 wt %, it may be difficult to meet the requirement of storage stability.

The proportion of at least one third (high-boiling) solvent selected from the group consisting of γ-butyrolactone, alkyl acetoacetate, dipropylene glycol methyl ether acetate, dipropylene glycol butyl ether, tripropylene glycol butyl ether, ethylene carbonate, and propylene carbonate is set in the range from 0.2% to 20% by weight based on the total solvent weight. Better results are obtained at a proportion of 0.2% to 10% by weight, and especially 1.0% to 10% by weight. Less than 0.2 wt % of the third solvent is less effective for facilitating coating whereas more than 20 wt % of the third solvent has a tendency that a resist pattern is undesirably constricted in cross-sectional shape.

In the resist composition, any well-known resist solvents (referred to as "fourth solvent") may be added to the mixture of the foregoing three solvents as long as this does not compromise the effects by a unique combination of three solvents, that is, as long as [1] the total amount of PGMEA and EL is at least 60% by weight of the total solvent weight, [2] a weight proportion of PGMEA relative to the total solvent weight is the highest among the solvents, [3] a weight proportion of EL is in the preferred range (10-40 wt %), and [4] a proportion of the third solvent is in the preferred range (0.2-20 wt %). Examples of the well-known solvents which can be added herein include ketones such as cyclohexanone and methyl-2-n-amylketone; alcohols such as 3-methoxybutanol, 3-methyl-3-methoxybutanol, 1-methoxy-2-propanol and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monoethyl ether acetate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate.

Of the fourth solvents, if added, propylene glycol monomethyl ether (PGME) is typical. In an embodiment wherein acid generators such as onium salts are contained in a relatively high concentration in order to enhance the resist sensitivity, PGME may be added for the purpose of improving the solubility of these components. The addition of PGME is effective when the onium salt is added in an amount of at least 7% by weight relative to the base polymer, for example, although the effectiveness varies, of course, depending on the structure of onium salt. PGME's effect of increasing the solubility of acid generator or the like is expectable when PGME is added in an amount of at least 10% by weight. Since PGME undesirably has a negative impact on coating property, it is preferred in addition to the above-limited ranges of the three solvents that the amount of PGME added be up to 40% by weight. This range of PGME added has no negative impact on storage stability and allows an acid generator to be added in a relatively large amount so that a resist pattern having a high sensitivity and minimized edge roughness may be obtained.

As used herein, the solvent mixture containing PGMEA and EL and further containing at least one third solvent selected from the group consisting of γ-butyrolactone, alkyl acetoacetate, dipropylene glycol methyl ether acetate, dipropylene glycol butyl ether, tripropylene glycol butyl ether, ethylene carbonate, and propylene carbonate has the advantage that a base resin, acid generator and additives can be homogeneously dissolved therein to form a resist composition. Then a resist film having a uniform distribution of components therein may be formed therefrom. When this resist film is worked through a series of steps from exposure to development, the resulting resist pattern is improved in LER. In addition, the resist composition has satisfactory storage stability.

The amount of the solvent mixture used in preparation of a resist composition should be determined appropriate, depending on the desired thickness of a resist film. When it is desired to form a satisfactory coating film having a thickness of 10 to 150 nm, the solvent mixture is preferably used in an amount of 1,400 to 5,000 parts, and more preferably 1,400 to 3,600 parts by weight per 100 parts by weight of the base resin.

While the solvent mixture is used to dissolve resist components therein to form a chemically amplified resist composition so that the resist composition may be effectively coated onto a processable substrate as mentioned above, the resist composition may be either positive or negative working.

In addition to the solvent mixture, the chemically amplified positive resist composition typically comprises:

(A-1) a base resin having acid labile group-protected acidic functional groups which is alkali insoluble or substantially alkali insoluble, but becomes alkali soluble when the acid labile groups are eliminated, (B) an acid generator, and (C) a nitrogen-containing compound serving as a base.

The base polymers used as component (A-1) in the chemically amplified positive resist compositions include polyhydroxystyrene (PHS), and copolymers of hydroxystyrene with styrene, (meth)acrylic acid esters or other polymerizable olefinic compounds, for KrF excimer laser and EB resist uses (see Patent Document 5, for example); (meth)acrylic acid ester polymers, alternating copolymers of cycloolefin with maleic anhydride, similar alternating copolymers further containing vinyl ethers or (meth)acrylic acid esters, polynorbornene, and ring-opening metathesis polymerized cycloolefins, for ArF excimer laser resist use (see Patent Document 7, for example); and fluorinated forms of the foregoing polymers (for both KrF and ArF laser uses) and polymers resulting from ring-closure polymerization using fluorinated dienes for $F_2$ laser resist use. Silicon-substituted forms of the foregoing polymers and polysilsesquioxane polymers are useful for the bilayer resists (see Patent Document 8, for example). The base resin is not limited to these polymer systems. The base polymers may be used alone or in admixture of two or more. In the case of positive resist compositions, it is a common practice to substitute acid labile groups for hydroxyl groups on phenol, carboxyl groups or fluorinated alkyl alcohols for reducing the rate of dissolution in unexposed regions.

The acid labile groups to be introduced into the base polymers may be selected from a variety of such groups, preferably from acetal groups of 2 to 30 carbon atoms and tertiary alkyl groups of 4 to 30 carbon atoms having the formulae (P1) and (P2), respectively.

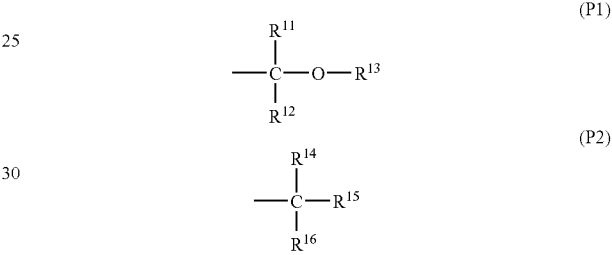

In formulae (P1) and (P2), $R^{11}$ and $R^{12}$ each are hydrogen or a straight, branched or cyclic alkyl group of 1 to 20 carbon atoms, preferably 1 to 12 carbon atoms, which may contain a heteroatom such as oxygen, sulfur, nitrogen or fluorine, $R^{13}$, $R^{14}$, $R^{15}$ and $R^{16}$ each are a straight, branched or cyclic alkyl group, aryl group or aralkyl group of 1 to 20 carbon atoms, preferably 1 to 12 carbon atoms, which may contain a heteroatom such as oxygen, sulfur, nitrogen or fluorine. A pair of $R^{11}$ and $R^{12}$, a pair of $R^{11}$ and $R^{13}$, a pair of $R^{12}$ and $R^{13}$, a pair of $R^{14}$ and $R^{15}$, a pair of $R^{14}$ and $R^{16}$, or a pair of $R^{15}$ and $R^{16}$, taken together, may form a non-aromatic ring of 3 to 20 carbon atoms, preferably 3 to 12 carbon atoms, with the carbon or oxygen atom to which they are attached.

Illustrative examples of the acetal group of formula (P1) include, but are not limited to, methoxymethyl, ethoxymethyl, propoxymethyl, butoxymethyl, isopropoxymethyl, t-butoxymethyl, 1-methoxyethyl, 1-methoxypropyl, 1-methoxybutyl, 1-ethoxyethyl, 1-ethoxypropyl, 1-ethoxybutyl, 1-propoxyethyl, 1-propoxypropyl, 1-propoxybutyl, 1-cyclopentyloxyethyl, 1-cyclohexyloxyethyl, 2-methoxyisopropyl, 2-ethoxyisopropyl, 1-phenoxyethyl, 1-benzyloxyethyl, 1-phenoxypropyl, 1-benzyloxypropyl, 1-adamantyloxyethyl, 1-adamantyloxypropyl, 2-tetrahydrofuryl, 2-tetrahydro-2H-pyranyl, 1-(2-cyclohexanecarbonyloxyethoxy)ethyl, 1-(2-cyclohexanecarbonyloxyethoxy)propyl, 1-[2-(1-adamantylcarbonyloxy)ethoxy]ethyl, and 1-[2-(1-adamantylcarbonyloxy)ethoxy]propyl.

Illustrative examples of the tertiary alkyl group of formula (P2) include, but are not limited to, t-butyl, t-pentyl, 1-ethyl-1-methylpropyl, 1,1-diethylpropyl, 1,1,2-trimethylpropyl, 1-adamantyl-1-methylethyl, 1-methyl-1-(2-norbornyl)ethyl, 1-methyl-1-(tetrahydrofuran-2-yl)ethyl, 1-methyl-1-(7-oxanorbornan-2-yl)ethyl, 1-methylcyclopentyl, 1-ethylcyclopentyl, 1-propylcyclopentyl, 1-cyclopentylcyclopentyl, 1-cyclohexylcyclopentyl, 1-(2-tetrahydrofuryl)cyclopentyl, 1-(7-oxanorbornan-2-yl)cyclopentyl, 1-methylcyclohexyl, 1-ethylcyclohexyl, 1-cyclopentylcyclohexyl, 1-cyclohexylcyclohexyl, 2-methyl-2-norbornyl, 2-ethyl-2-norbornyl, 8-methyl-8-tricyclo[5.2.1.0$^{2,6}$]decyl, 8-ethyl-8-tricyclo[5.2.1.0$^{2,6}$]decyl, 3-methyl-3-tetracyclo[4.4.0.1$^{2,5}$.1$^{7,10}$]dodecyl, 3-ethyl-3-tetracyclo[4.4.0.1$^{2,5}$.1$^{7,10}$]dodecyl, 2-methyl-2-adamantyl, 2-ethyl-2-adamantyl, 1-methyl-3-oxo-1-cyclohexyl, 1-methyl-1-(tetrahydrofuran-2-yl)ethyl, 5-hydroxy-2-methyl-2-adamantyl, and 5-hydroxy-2-ethyl-2-adamantyl.

In the base resin, some hydroxyl groups may be linked via acid labile groups of the following general formula (P3a) or (P3b) for crosslinkage between molecules or within a molecule.

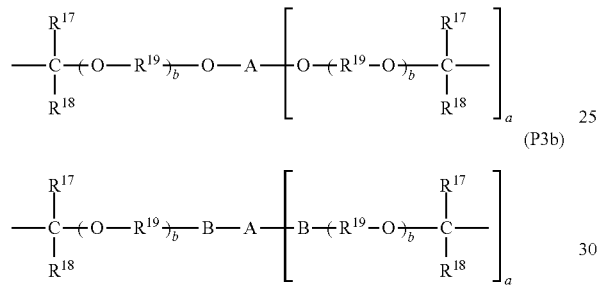

(P3a)

(P3b)

Herein, $R^{17}$ and $R^{18}$ each are hydrogen or a straight, branched or cyclic alkyl group of 1 to 8 carbon atoms, or $R^{17}$ and $R^{18}$, taken together, may form a ring with the carbon atom to which they are attached. Each of $R^{17}$ and $R^{18}$ is a straight or branched alkylene group of 1 to 8 carbon atoms when they form a ring. $R^{19}$ is a straight, branched or cyclic alkylene group of 1 to 10 carbon atoms. Letter "a" is an integer of 1 to 7, and "b" is 0 or an integer of 1 to 10. "A" is a (a+1)-valent aliphatic or alicyclic saturated hydrocarbon group, aromatic hydrocarbon group or heterocyclic group of 1 to 50 carbon atoms, which may have an intervening heteroatom and in which some hydrogen atoms may be replaced by hydroxyl groups, carboxyl groups, carbonyl groups or fluorine atoms. B is —CO—O—, —NHCO—O— or —NHCONH—.

Illustrative examples of the crosslinking acetal linkages represented by formulae (P3a) and (P3b) are given below as (P3)-1 through (P3)-8, but not limited thereto.

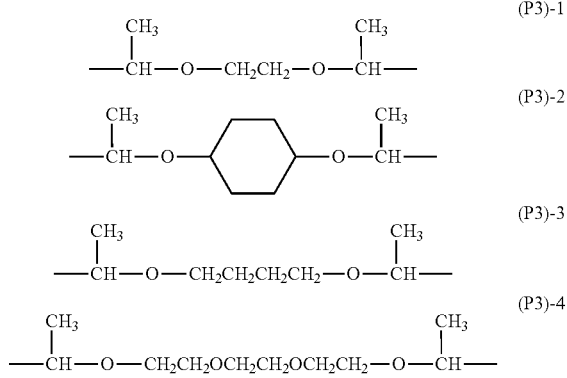

(P3)-1

(P3)-2

(P3)-3

(P3)-4

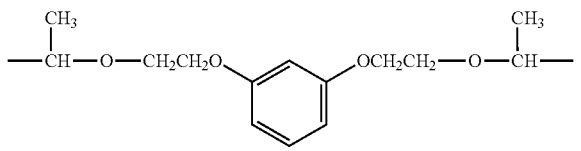

(P3)-5

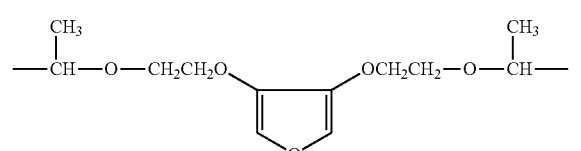

(P3)-6

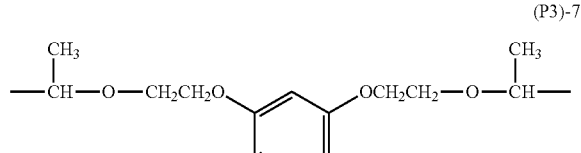

(P3)-7

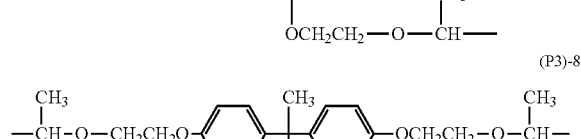

(P3)-8

Preferably the base polymer has a weight average molecular weight (Mw) of 2,000 to 100,000 as measured by gel permeation chromatography (GPC) using polystyrene standards. With Mw below 2,000, film formation and resolution may become poor. With Mw beyond 100,000, resolution may become poor or foreign matter may generate during pattern formation.

In addition to the solvent mixture, the chemically amplified negative resist composition typically comprises:

(A-2) a base resin which is alkali soluble, but becomes alkali insoluble in the presence of an acid catalyst and/or a combination of a crosslinker and a base resin which is alkali soluble, but becomes alkali insoluble through reaction with the crosslinker in the presence of an acid catalyst, (B) an acid generator, and (C) a nitrogen-containing compound serving as a base.

The base polymers used as component (A-2) in the chemically amplified negative resist compositions include polyhydroxystyrene (PHS), and copolymers of hydroxystyrene with styrene, (meth)acrylic acid esters or other polymerizable olefinic compounds, for KrF excimer laser and EB resist uses (see Patent Documents 9 and 10, for example); (meth)acrylic acid ester polymers, alternating copolymers of cycloolefin with maleic anhydride, similar alternating copolymers further containing vinyl ethers or (meth)acrylic acid esters, polynorbornene, and ring-opening metathesis polymerized cycloolefins, for ArF excimer laser resist use (see Patent Document 11, for example); and fluorinated forms of the foregoing polymers (for both KrF and ArF laser uses) and polymers resulting from ring-closure polymerization using fluorinated dienes for $F_2$ laser resist use. Silicon-substituted forms of the foregoing polymers and polysilsesquioxane polymers are useful for the bilayer resists. The base resin is not limited to these polymer systems. The base polymers may be used alone or in admixture of two or more. In the case of negative resist compositions, it is a common practice to acquire alkali solubility by utilizing hydroxyl groups on phenol, carboxyl groups or fluorinated alkyl alcohols, and on the other hand, to reduce the rate of dissolution of the polymer by causing the polymer to be intermolecularly crosslinked upon acid generation. The latter is achieved by the method of incorporating into the polymer units having substituent groups capable of forming bonds with other units in an electrophilic manner, for example, epoxy and acetal groups and/or the method of adding a crosslinker separately to the polymer.

While the base polymers for use in KrF excimer laser or EB lithography are described in Patent Document 9, for example, typical examples extracted therefrom are shown below.

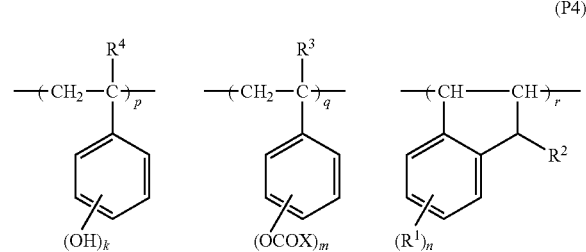

(P4)

Herein X is a straight or branched $C_1$-$C_4$ alkyl group or straight or branched $C_1$-$C_4$ alkoxy group, $R^1$ and $R^2$ are each independently hydrogen, hydroxy, a straight or branched alkyl group, optionally substituted alkoxy group, or halogen atom; $R^3$ and $R^4$ are hydrogen or methyl; n is an integer of 1 to 4, m and k each are an integer of 1 to 5, p, q and r are positive numbers. Preferably the base polymer comprising recurring units of formula (P4) has a weight average molecular weight (Mw) of 1,000 to 500,000 as measured by GPC using polystyrene standards.

In these examples, alkali solubility is provided by the acidity of phenolic hydroxyl groups. Where it is desired to endow a polymer itself with a crosslinking ability, a glycidyl group is incorporated in X so that the polymer may become crosslink-reactive between molecules in the presence of an acid catalyst. Crosslink-reactive units may be incorporated by copolymerizing an acrylic ester whose ester moiety is endowed with crosslink-reactivity.

In the embodiment comprising an alkali soluble base resin combined with a crosslinker, the base polymer may not be provided with electrophilic reactivity.

The crosslinker used in the negative resist composition may be any of crosslinkers which induce intramolecular and intermolecular crosslinkage to the polymer with the aid of the acid generated by the photoacid generator as component (B). Suitable crosslinkers include alkoxymethylglycolurils and alkoxymethylmelamines. Examples of suitable alkoxymethylglycolurils include tetramethoxymethylglycoluril, 1,3-bismethoxymethyl-4,5-bismethoxyethylene urea, and bismethoxymethyl urea. Examples of suitable alkoxymethylmelamines include hexamethoxymethylmelamine and hexaethoxymethylmelamine.

A crosslinker having no chemical amplifying function may be added in an auxiliary manner. Typical crosslinkers having no chemical amplifying function and providing a high sensitivity are polyfunctional azides. Suitable polyfunctional azides include 4,4'-diazidophenyl sulfide, bis(4-azidobenzyl)methane, bis(3-chloro-4-azidobenzyl)methane, bis-4-azidobenzylidene, 2,6-bis(4-azidobenzylidene)-cyclohexanone, and 2,6-bis(4-azidobenzylidene)-4-methylcyclohexanone.

Typical of the acid generator (B) is a photoacid generator. The photoacid generator may be any of compounds which generate acid upon exposure to high-energy radiation. Suitable photoacid generators include sulfonium salts, iodonium salts, sulfonyldiazomethane and N-sulfonyloxyimide photoacid generators, examples of which are well known. While numerous photoacid generators are described in Patent Documents 7 to 11, any desired one may be selected among them in accordance with the teaching thereof. Use may also be made of acid generators incorporated in base polymers as component (A) as disclosed in Patent Documents 12 and 13.

In the chemically amplified resist composition, an appropriate amount of the photoacid generator is, but not limited to, 0.1 to 10 parts, and especially 0.1 to 5 parts by weight per 100 parts by weight of the base resin. Too high a proportion of the photoacid generator may give rise to problems of degraded resolution and foreign matter upon development and resist film peeling. The photoacid generators may be used alone or in admixture of two or more. The transmittance of the resist film can be controlled by using a photoacid generator having a low transmittance at the exposure wavelength and adjusting the amount of the photoacid generator added.

In the chemically amplified resist composition, nitrogen-containing compounds may be added as a basic component (C). As is well known in the art, the inclusion of nitrogen-containing compounds holds down the influence of air-borne basic compounds and is thus effective for PED. In addition, they are known to control the influence of substrates.

The nitrogen-containing compound may be any of well-known nitrogen-containing organic compounds used in prior art resist compositions, especially chemically amplified resist compositions. Examples include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, imide derivatives, and carbamate derivatives. While numerous nitrogen-containing compounds are described in Patent Documents 7 to 11 and 13, any desired one may be selected among them in accordance with the teaching thereof.

The nitrogen-containing compound (C) is preferably formulated in an amount of 0.01 to 2 parts, and especially 0.01 to 1 part by weight, per 100 parts by weight of the base resin (A). Less amounts of the nitrogen-containing compound achieve no or little addition effect whereas excessive amounts may result in too low a sensitivity.

The resist composition of the invention may include optional ingredients, for example, known dissolution inhibitors, surfactants, acidic compounds, dyes, thermal crosslinkers, and stabilizers.

Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products Co., Ltd.), Megaface F171, F172 and F173 (Dainippon Ink & Chemicals, Inc.), Fluorad FC430 and FC431 (Sumitomo 3M Co., Ltd.), Asahiguard AG710, Surflon S-381, S-382, SC101, SC102, SC103, SC104, SC105, SC106, KH-10, KH-20, KH-30 and KH-40 (Asahi Glass Co., Ltd.), and Surfynol E1004 (Nisshin Chemical Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo K.K.). Inter alia, Fluorad FC430, Surflon S-381, Surfynol E1004, KH-20 and KH-30 are preferred. These surfactants may be used alone or in admixture.

In the resist composition, the surfactant is preferably formulated in an amount of up to 2 parts, and especially up to 1 part by weight, per 100 parts by weight of the base resin.

Process

The resist composition formulated as above is used to form a resist film on a processable substrate (or substrate to be processed). The process includes the steps of coating the resist composition onto the processable substrate and prebaking. These steps may be performed by well-known techniques. Depending on a particular purpose, a resist film having a thickness in the range of 10 to 2,000 nm may be formed. The coating step may be performed by spin coating and several other known techniques. Where a resist film having a thickness of about 150 nm or less is formed, spin coating is most preferred to achieve a uniform film thickness.

Where the processable substrate is a semiconductor wafer, spin coating conditions must be adjusted in accordance with the wafer size, the desired film thickness, the composition of resist, and the like. In an example wherein a resist film having a thickness of about 100 nm is formed on a 8-inch wafer, the resist composition is cast on the wafer, after which the wafer is spun at 4,000 to 5,000 rpm for 40 seconds. Then a resist film featuring uniformity is obtained. In this example, the amount of the solvent mixture used in the preparation of the resist composition is preferably 1,400 to 1,600 parts by weight per 100 parts by weight of the base resin. The resist coating thus applied is then prebaked in order to remove the excess solvent remaining in the coating. The prebaking is preferably performed, for example, on a hot plate at a temperature of 80 to 130° C. for 1 to 10 minutes, more preferably at 90 to 110° C. for 3 to 5 minutes.

Where the processable substrate is a photomask blank, coating conditions must also be adjusted in accordance with the blank size, the desired film thickness, the composition of resist, and the like. In an example wherein a resist film having a thickness of about 100 nm is formed on a square blank of 15.2 cm×15.2 cm, the resist composition is cast on the blank, after which the blank is spun at 1,500 to 3,000 rpm for 2 seconds and then at or below 800 rpm for 30 seconds. Then a resist film featuring uniformity is obtained. In this example, the amount of the solvent mixture used in the preparation of the resist composition is preferably 2,000 to 2,700 parts by weight per 100 parts by weight of the base resin. The resist coating thus applied is then prebaked in order to remove the excess solvent remaining in the coating. The prebaking is preferably performed, for example, on a hot plate at a temperature of 80 to 130° C. for 4 to 20 minutes, more preferably at 90 to 110° C. for 8 to 12 minutes.

Next, the resist film thus formed is subjected to patternwise exposure to form the desired pattern. In the case of semiconductor processing, exposure may be performed by placing a mask having the desired pattern over the resist film, and irradiating high-energy radiation (e.g., deep UV, excimer laser or x-ray) or electron beam (EB) so as to give an exposure dose of 1 to 100 µC/cm², preferably 10 to 100 µC/cm². The exposure may be performed by standard lithography or if desired, by immersion lithography of filling a liquid between the projection lens and the resist film.

Where a photomask blank is processed, the patternwise exposure is generally beam exposure because this processing does not aim to produce a number of identical parts. The high-energy radiation used herein is typically electron beam although any radiation from other light sources may be similarly used as long as the radiation is collected into a beam.

Following the exposure, the resist film is typically baked in order to cause the acid to diffuse to induce chemical amplifying reaction. The post-exposure baking (PEB) is preferably performed, for example, on a hot plate at a temperature of 60 to 150° C. for 0.1 to 5 minutes, more preferably at 80 to 140° C. for 0.5 to 3 minutes. The resist film is then developed with a developer in the form of an aqueous alkaline solution, typically a 0.1 to 5 wt %, preferably 2 to 3 wt % aqueous solution of tetramethylammonium hydroxide (TMAH) for 0.1 to 3 minutes, preferably 0.5 to 2 minutes by a standard technique such as dip, puddle or spray technique. In this way, the desired pattern is formed on the substrate.

The development is followed by further heat treatment for sintering the pattern to improve LER. The post-development heat treatment is preferably performed, for example, on a hot plate at a temperature of 90 to 190° C. for 1 to 15 minutes, specifically 2 to 12 minutes, more preferably at 110 to 160° C. for 3 to 10 minutes, for thereby sintering the pattern following development. The temperature of post-development heat treatment is preferably equal to or higher than the prebaking and PEB temperatures.

The pattern forming process of the invention is best suited in nano-scale patterning using selected high-energy radiation such as deep-UV or excimer laser having a wavelength 250 to 120 nm, EUV, x-ray or EB.

EXAMPLE

Examples and Comparative Examples are given below by way of illustration and not by way of limitation.

The components used in the resist compositions are identified below. Base polymers (Polymer-1, 2) and acid generators (PAG-1, 2) have the structural formula shown below. The weight average molecular weight (Mw) and number average molecular weight (Mn) are determined by gel permeation chromatography (GPC) versus polystyrene standards.

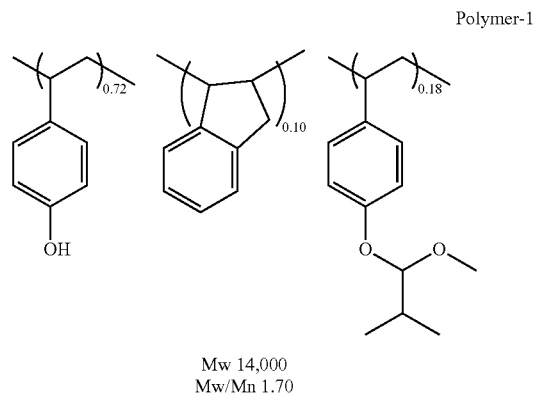

Polymer-1

Mw 14,000
Mw/Mn 1.70

-continued

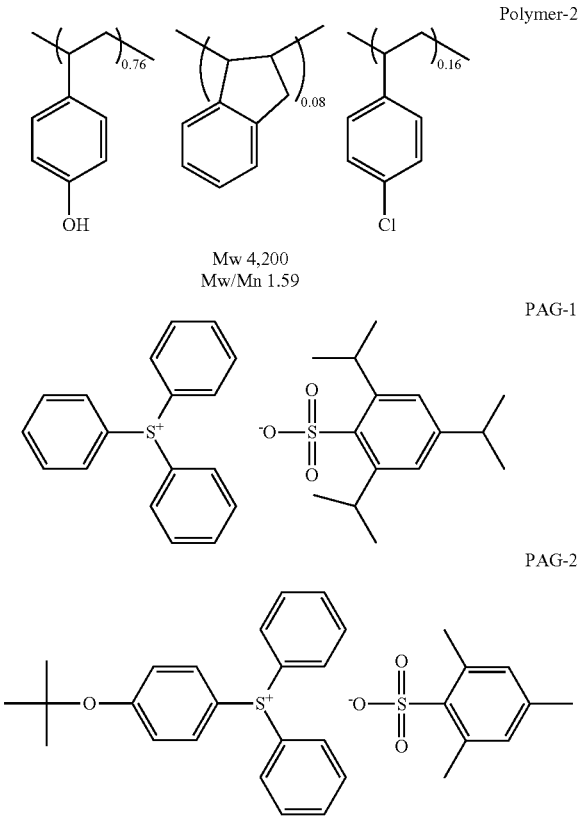

Polymer-2

Mw 4,200
Mw/Mn 1.59

PAG-1

PAG-2

Solvent A: propylene glycol monomethyl ether acetate (PGMEA)
Solvent B: propylene glycol monomethyl ether (PGME)
Solvent C: ethyl lactate (EL)
N-containing compound A: tris(2-(methoxymethoxy)ethyl)amine
N-containing compound B: oxidized tris(2-(methoxymethoxy)ethyl)amine
Surfactant A: PolyFox PF-636 (Omnova Solutions Inc.)
Crosslinker A: hexamethoxymethylglycoluril Example 1 and Comparative Examples 1-3

Chemically amplified positive resist compositions were prepared in accordance with the formulation of Table 1 using solvent mixtures. The pattern forming process of the invention was implemented using the compositions, and the resulting patterns were evaluated for resolution and profile. Whether or not post-development heat treatment was performed is reported at the last row of Table 1.

TABLE 1

| Components, pbw | Example 1 | Comparative Example 1 | Comparative Example 2 | Comparative Example 3 |
|---|---|---|---|---|
| Polymer-1 | 80 | 80 | 80 | 80 |
| PAG-1 | 6 | 6 | 6 | 6 |
| PAG-2 | 2 | 2 | 2 | 2 |
| PGMEA | 1400 | 1400 | 1400 | 1400 |
| EL | 600 | 600 | 600 | 600 |
| γ-butyrolactone | 160 | 160 | — | — |
| Surfactant A | 0.07 | 0.07 | 0.07 | 0.07 |
| N-containing compound A | 0.3 | 0.3 | 0.3 | 0.3 |
| N-containing compound B | 0.3 | 0.3 | 0.3 | 0.3 |
| Post-development heat treatment | yes | no | yes | no |

The resist compositions were filtered through a 0.04-μm nylon resin filter and then spin-coated onto mask blanks of 152 mm square having an outermost surface of chromium oxynitride to a thickness of 150 nm. The coating conditions included: 1,000 rpm×1 sec, 2,500 rpm×1.5 sec, 800 rpm×5 sec, 100 rpm×30 sec, and 2,000 rpm×30 sec. The coated mask blanks were baked on a hot plate at 90° C. for 10 minutes.

The film thickness was measured by an optical film thickness measurement system NanoSpec (Nanometrics Inc.). Measurement was carried out at 81 in-plane points on the blank substrate excluding an outer rim portion extending 10 mm inward from the blank circumference. From these measurements, an average film thickness and a film thickness range (i.e., the difference between minimum and maximum of film thickness) were determined.

Then, using an EB mask writer EBM5000 (NuFLARE Technology Inc., accelerating voltage 50 keV), the resist films were exposed. They were baked (PEB) at 110° C. for 10 minutes, and developed with a 2.38 wt % aqueous solution of TMAH, obtaining positive patterns. After development, the patterns were further baked at 130° C. for 4 minutes (Example 1, Comparative Examples 1-3).

The resulting resist patterns were evaluated as follows. The optimum exposure dose (sensitivity Eop) was the exposure dose which provided a 1:1 resolution at the top and bottom of a 200-nm line-and-space pattern. The minimum line width (nm) of a line-and-space pattern which was ascertained separate on the mask blank when processed at the optimum dose was the resolution of a test resist. The shape in cross section of the resolved resist pattern was observed under a scanning electron microscope (SEM).

For line edge roughness (LER), deviations were measured at 50 points in a longitudinal 5-μm region of a 100-nm line, using measurement SEM (S-8840 by Hitachi, Ltd.). A value of 3σ was computed, with smaller values indicating better performance.

Coating property was evaluated based on the film thickness range.

Table 2 reports the test results of resolution, profile (cross-sectional shape), LER, and coating property.

TABLE 2

| | Resolution, nm | Profile | LER, nm | Film thickness range, nm |
|---|---|---|---|---|
| Example 1 | 50 | rectangular | 2.5 | 3 |
| Comparative Example 1 | 50 | rectangular | 3 | 3 |
| Comparative Example 2 | 50 | rectangular | 5 | 4 |
| Comparative Example 3 | 50 | rectangular | 5 | 4 |

As seen from Table 2, Example 1 attains an LER improvement of 0.5 nm over Comparative Example 1 which omitted post-development heat treatment. In Comparative Examples 2 and 3 which lacked γ-butyrolactone, LER is more than in Comparative Example 1, and LER is not improved by post-development heat treatment. It is demonstrated that a high-boiling solvent, γ-butyrolactone is essential in order to achieve an LER improvement by post-development heat treatment. A comparison between Comparative Examples 1 and 3 indicates that the addition of a high-boiling solvent, γ-butyrolactone enables to form a uniform film and hence, reduce the film thickness range, which is effective for LER improvement.

Examples 2-7 and Comparative Examples 4-9

As in Example 1, resist compositions were prepared in accordance with the formulation of Tables 3 and 4. The high-boiling solvent in Example 1 was replaced by tert-butyl acetoacetate, dipropylene glycol methyl ether acetate, dipropylene glycol butyl ether, tripropylene glycol butyl ether, ethylene carbonate, and propylene carbonate. The resulting patterns were evaluated for resolution and profile.

Pattern formation was carried out as in Example 1 by spin coating the resist solution onto a mask blank. After development, the patterns were further baked at 130° C. for 4 minutes. Whether or not post-development heat treatment was performed is reported at the last row of Tables 3 and 4.

Tables 5 and 6 report the test results of resolution, profile (cross-sectional shape), LER, and coating property.

TABLE 3

| Components, pbw | Example | | | | | |
|---|---|---|---|---|---|---|
| | 2 | 3 | 4 | 5 | 6 | 7 |
| Polymer-1 | 80 | 80 | 80 | 80 | 80 | 80 |
| PAG-1 | 6 | 6 | 6 | 6 | 6 | 6 |
| PAG-2 | 2 | 2 | 2 | 2 | 2 | 2 |
| PGMEA | 1400 | 1400 | 1400 | 1400 | 1400 | 1400 |
| EL | 600 | 600 | 600 | 600 | 600 | 600 |
| γ-butyrolactone | — | — | — | — | — | — |
| tert-butyl acetoacetate | 160 | — | — | — | — | — |
| dipropylene glycol methyl ether acetate | — | 160 | — | — | — | — |
| dipropylene glycol butyl ether | — | — | 160 | — | — | — |
| tripropylene glycol butyl ether | — | — | — | 160 | — | — |
| ethylene carbonate | — | — | — | — | 160 | — |
| propylene carbonate | — | — | — | — | — | 160 |
| Surfactant A | 0.07 | 0.07 | 0.07 | 0.07 | 0.07 | 0.07 |
| N-containing compound A | 0.3 | 0.3 | 0.3 | 0.3 | 0.3 | 0.3 |
| N-containing compound B | 0.3 | 0.3 | 0.3 | 0.3 | 0.3 | 0.3 |
| Post-development heat treatment | yes | yes | yes | yes | yes | yes |

TABLE 4

| Components, pbw | Comparative Example | | | | | |
|---|---|---|---|---|---|---|
| | 4 | 5 | 6 | 7 | 8 | 9 |
| Polymer-1 | 80 | 80 | 80 | 80 | 80 | 80 |
| PAG-1 | 6 | 6 | 6 | 6 | 6 | 6 |
| PAG-2 | 2 | 2 | 2 | 2 | 2 | 2 |
| PGMEA | 1400 | 1400 | 1400 | 1400 | 1400 | 1400 |
| EL | 600 | 600 | 600 | 600 | 600 | 600 |
| γ-butyrolactone | — | — | — | — | — | — |
| tert-butyl acetoacetate | 160 | — | — | — | — | — |
| dipropylene glycol methyl ether acetate | — | 160 | — | — | — | — |
| dipropylene glycol butyl ether | — | — | 160 | — | — | — |
| tripropylene glycol butyl ether | — | — | — | 160 | — | — |
| ethylene carbonate | — | — | — | — | 160 | — |
| propylene carbonate | — | — | — | — | — | 160 |
| Surfactant A | 0.07 | 0.07 | 0.07 | 0.07 | 0.07 | 0.07 |
| N-containing compound A | 0.3 | 0.3 | 0.3 | 0.3 | 0.3 | 0.3 |
| N-containing compound B | 0.3 | 0.3 | 0.3 | 0.3 | 0.3 | 0.3 |
| Post-development heat treatment | no | no | no | no | no | no |

TABLE 5

| | Resolution, nm | Profile | LER, nm | Film thickness range, nm |
|---|---|---|---|---|
| Example 2 | 50 | rectangular | 2.5 | 4 |
| Example 3 | 50 | rectangular | 1.5 | 3 |
| Example 4 | 50 | rectangular | 1.5 | 3 |
| Example 5 | 50 | rectangular | 1.5 | 3 |
| Example 6 | 50 | rectangular | 2.5 | 3 |
| Example 7 | 50 | rectangular | 2.5 | 3 |

TABLE 6

| | Resolution, nm | Profile | LER, nm | Film thickness range, nm |
|---|---|---|---|---|
| Comparative Example 4 | 50 | rectangular | 3 | 4 |
| Comparative Example 5 | 50 | rectangular | 2 | 3 |
| Comparative Example 6 | 50 | rectangular | 2 | 3 |
| Comparative Example 7 | 50 | rectangular | 2 | 3 |
| Comparative Example 8 | 50 | rectangular | 3 | 3 |
| Comparative Example 9 | 50 | rectangular | 3 | 3 |

As seen from the above results, even when the high-boiling solvent in Example 1 is replaced by tert-butyl acetoacetate, dipropylene glycol methyl ether acetate, dipropylene glycol butyl ether, tripropylene glycol butyl ether, ethylene carbonate, and propylene carbonate, effective coating and improved LER are observed as in Example 1. All Examples 2 to 7 attain an LER improvement of 0.5 nm over Comparative Examples which omitted post-development heat treatment.

Examples 8-14

As in Example 1, resist compositions were prepared in accordance with the formulation of Table 7. To the resist compositions of Examples 1 to 7, propylene glycol monomethyl ether (PGME) was added as the fourth solvent. Pattern formation was carried out as in Example 1 by spin coating the resist solution onto a mask blank. The resulting patterns were evaluated for resolution and profile.

Table 8 reports the test results of resolution, profile (cross-sectional shape), LER, and coating property.

coating and an LER improvement of 0.5 nm due to post-development heat treatment as long as a weight proportion of PGMEA is the highest among the solvents, EL accounts for 10-40 wt % based on the total solvent weight, and the third solvent selected from γ-butyrolactone, alkyl acetoacetate, dipropylene glycol methyl ether acetate, dipropylene glycol butyl ether, tripropylene glycol butyl ether, ethylene carbonate, and propylene carbonate accounts for 0.2-10 wt % based on the total solvent weight.

TABLE 7

| Components, pbw | Example | | | | | | |
|---|---|---|---|---|---|---|---|
| | 8 | 9 | 10 | 11 | 12 | 13 | 14 |
| Polymer-1 | 80 | 80 | 80 | 80 | 80 | 80 | 80 |
| PAG-1 | 6 | 6 | 6 | 6 | 6 | 6 | 6 |
| PAG-2 | 2 | 2 | 2 | 2 | 2 | 2 | 2 |
| PGMEA | 900 | 900 | 900 | 900 | 900 | 900 | 900 |
| EL | 600 | 600 | 600 | 600 | 600 | 600 | 600 |
| PGME | 600 | 600 | 600 | 600 | 600 | 600 | 600 |
| γ-butyrolactone | 160 | — | — | — | — | — | — |
| tert-butyl acetoacetate | — | 160 | — | — | — | — | — |
| dipropylene glycol methyl ether acetate | — | — | 160 | — | — | — | — |
| dipropylene glycol butyl ether | — | — | — | 160 | — | — | — |
| tripropylene glycol butyl ether | — | — | — | — | 160 | — | — |
| ethylene carbonate | — | — | — | — | — | 160 | — |
| propylene carbonate | — | — | — | — | — | — | 160 |
| Surfactant A | 0.07 | 0.07 | 0.07 | 0.07 | 0.07 | 0.07 | 0.07 |
| N-containing compound A | 0.3 | 0.3 | 0.3 | 0.3 | 0.3 | 0.3 | 0.3 |
| N-containing compound B | 0.3 | 0.3 | 0.3 | 0.3 | 0.3 | 0.3 | 0.3 |

TABLE 8

| | Resolution, nm | Profile | LER, nm | Film thickness range, nm |
|---|---|---|---|---|
| Example 8 | 50 | rectangular | 2.5 | 4 |
| Example 9 | 50 | rectangular | 2.5 | 4 |
| Example 10 | 50 | rectangular | 1.5 | 3 |
| Example 11 | 50 | rectangular | 1.5 | 3 |
| Example 12 | 50 | rectangular | 1.5 | 3 |
| Example 13 | 50 | rectangular | 2.5 | 3 |
| Example 14 | 50 | rectangular | 2.5 | 3 |

As seen from the above results, the resist compositions to which PGME is added as the fourth solvent show effective

Examples 15-21 and Comparative Example 10

For the purpose of facilitating formation of thinner films, resist compositions were prepared in accordance with the formulation of Table 9. Pattern formation was carried out as in Example 1 by spin coating the resist solution onto a mask blank. Since the resist compositions had a lower concentration, the films formed by coating had a thickness of 90 nm despite the same coating conditions as in Example 1. The resulting patterns were evaluated for resolution and profile.

Table 10 reports the test results of resolution, profile (cross-sectional shape), LER, and coating property. The thinner film permitted resolution of a 40 nm pattern without collapse.

TABLE 9

| Components, pbw | Example | | | | | | | Comparative Example 10 |
|---|---|---|---|---|---|---|---|---|
| | 15 | 16 | 17 | 18 | 19 | 20 | 21 | |
| Polymer-1 | 80 | 80 | 80 | 80 | 80 | 80 | 80 | 80 |
| PAG-1 | 6 | 6 | 6 | 6 | 6 | 6 | 6 | 6 |
| PAG-2 | 2 | 2 | 2 | 2 | 2 | 2 | 2 | 2 |
| PGMEA | 1200 | 1200 | 1200 | 1200 | 1200 | 1200 | 1200 | 1200 |
| EL | 700 | 700 | 700 | 700 | 700 | 700 | 700 | 700 |
| PGME | 800 | 800 | 800 | 800 | 800 | 800 | 800 | 800 |
| γ-butyrolactone | 180 | — | — | — | — | — | — | — |
| tert-butyl acetoacetate | — | 180 | — | — | — | — | — | — |
| dipropylene glycol methyl ether acetate | — | — | 180 | — | — | — | — | — |
| dipropylene glycol butyl ether | — | — | — | 180 | — | — | — | — |
| tripropylene glycol butyl ether | — | — | — | — | 180 | — | — | — |
| ethylene carbonate | — | — | — | — | — | 180 | — | — |

TABLE 9-continued

|  | Example | | | | | | | Comparative |
|---|---|---|---|---|---|---|---|---|
| Components, pbw | 15 | 16 | 17 | 18 | 19 | 20 | 21 | Example 10 |
| propylene carbonate | — | — | — | — | — | — | 180 | — |
| Surfactant A | 0.07 | 0.07 | 0.07 | 0.07 | 0.07 | 0.07 | 0.07 | 0.07 |
| N-containing compound A | 0.3 | 0.3 | 0.3 | 0.3 | 0.3 | 0.3 | 0.3 | 0.3 |
| N-containing compound B | 0.3 | 0.3 | 0.3 | 0.3 | 0.3 | 0.3 | 0.3 | 0.3 |

TABLE 10

|  | Resolution, nm | Profile | LER, nm | Film thickness range, nm |
|---|---|---|---|---|
| Example 15 | 40 | rectangular | 3.5 | 4 |
| Example 16 | 40 | rectangular | 3.5 | 4 |
| Example 17 | 40 | rectangular | 1.5 | 3 |
| Example 18 | 40 | rectangular | 1.5 | 3 |
| Example 19 | 40 | rectangular | 1.5 | 3 |
| Example 20 | 40 | rectangular | 3.5 | 4 |
| Example 21 | 40 | rectangular | 2.5 | 4 |
| Comparative Example 10 | 40 | rectangular | 6 | 6 |

The prior art resist composition (Comparative Example 10) suffers from the problems of inefficient coating and increased LER when a thin film has to be formed therefrom. In contrast, the resist compositions containing the high-boiling solvent are effectively coated even when thin films having a thickness of less than 100 nm are formed therefrom, and an LER improvement of 0.5 nm is observed due to post-development heat treatment.

Examples 22-24 and Comparative Examples 11-13

For the purpose of evaluating pattern size change and LER versus the temperature of post-development heat treatment, resist compositions were prepared in accordance with Example 3 in Table 3 and Comparative Example 2 in Table 1. A pattern size change, LER, and a film thinning of resist pattern by post-development heat treatment were evaluated.

By spin coating the resist solution onto a mask blank and subsequently processing as in Example 1, a pattern having a line width of 50 nm was formed. Post-development heat treatment was performed at a temperature of 130° C., 140° C., 150° C. or 160° C. for 4 minutes.

Table 12 reports the test results of pattern size change, profile (cross-sectional shape), LER, and a film thinning of resist pattern.

TABLE 12

|  | Patten size change, nm | Profile | LER, nm | Film thinning, nm |
|---|---|---|---|---|
| Example 3 | 1.5 | rectangular | 1.5 | 1 |
| Example 22 | 2 | rectangular | 1.4 | 1.5 |
| Example 23 | 2.5 | rectangular | 1.4 | 2 |
| Example 24 | 6 | rounded top | 1.3 | 5 |
| Comparative Example 11 | 2 | rectangular | 5 | 1.5 |
| Comparative Example 12 | 2.5 | rectangular | 5 | 2 |
| Comparative Example 13 | 6 | rounded top | 4.5 | 5 |

Post-development heat treatment at 130° C. achieves a LER improvement of 0.5 nm and controls a film thinning to 1 nm, indicating an appropriate heating temperature.

As the temperature of post-development heat treatment raises to 140° C. and 150° C., the film thinning and pattern size change increase though LER improves. At the temperature of 160° C., noticeable increases of film thinning and pattern size change were observed, and the pattern profile was rounded at the top.

It is believed that above 160° C., the resist film is degraded with a buildup of volatile ingredients. The tendency that film thinning and pattern size change are increased at 160° C. is also true in Comparative Example 13 which lacks the high-boiling solvent.

As is evident from the above, it is preferred for preventing the post-development heat treatment from causing a substantial change to the pattern profile that the temperature of post-development heat treatment be not higher than the incipient degradation temperature of the resist film.

Examples 25-29 and Comparative Examples 14-15

For the purpose of evaluating the temperature of post-development heat treatment capable of LER improvement versus the content of high-boiling solvent, resist compositions were prepared in accordance with the formulation of

TABLE 11

|  | Example | | | | Comparative Example | | |
|---|---|---|---|---|---|---|---|
|  | 3 | 22 | 23 | 24 | 11 | 12 | 13 |
| Composition | Example 3 | Example 3 | Example 3 | Example 3 | Comparative Example 2 | Comparative Example 2 | Comparative Example 2 |
| Post-development heat treatment | 130° C. | 140° C. | 150° C. | 160° C. | 140° C. | 150° C. | 160° C. |

Table 13. The temperature of post-development heat treatment capable of LER improvement was determined as well as a pattern size change and LER at that temperature.

By spin coating the resist solution onto a mask blank and subsequently processing as in Example 1, a pattern having a line width of 50 nm was formed. Post-development heat treatment was performed at a temperature of 110° C., 120° C., 130° C., 140° C., 150° C. or 160° C. for 4 minutes.

Table 14 reports the test results of pattern size change, profile (cross-sectional shape), LER, and the heat treatment temperature effective for LER improvement.

may be lower as the content of high-boiling solvent (dipropylene glycol methyl ether acetate) increases. In Comparative Example 15 containing 560 parts by weight of the high-boiling solvent, the heat treatment temperature of 110° C. was effective for LER improvement, but the pattern profile was constricted when the pattern was formed, and this constriction was not relieved by the heat treatment. In Example 25 having a lower content of the high-boiling solvent, the effective heat treatment temperature was 150° C. In Comparative Example 14 having a further lower content of the high-boiling solvent, the effective heat treatment temperature was 160° C.,

TABLE 13

| Components, pbw | Example | | | | | | Comparative Example | |
|---|---|---|---|---|---|---|---|---|
| | 3 | 25 | 26 | 27 | 28 | 29 | 14 | 15 |
| Polymer-1 | 80 | 80 | 80 | 80 | 80 | 80 | 80 | 80 |
| PAG-1 | 6 | 6 | 6 | 6 | 6 | 6 | 6 | 6 |
| PAG-2 | 2 | 2 | 2 | 2 | 2 | 2 | 2 | 2 |
| PGMEA | 1400 | 1400 | 1400 | 1400 | 1400 | 1400 | 1400 | 1400 |
| EL | 600 | 600 | 600 | 600 | 600 | 600 | 600 | 600 |
| dipropylene glycol methyl ether acetate | 160 | 80 | 240 | 320 | 400 | 480 | 20 | 560 |
| Surfactant A | 0.07 | 0.07 | 0.07 | 0.07 | 0.07 | 0.07 | 0.07 | 0.07 |
| N-containing compound A | 0.3 | 0.3 | 0.3 | 0.3 | 0.3 | 0.3 | 0.3 | 0.3 |
| N-containing compound B | 0.3 | 0.3 | 0.3 | 0.3 | 0.3 | 0.3 | 0.3 | 0.3 |

TABLE 14

| | Pattern size change, nm | Profile | LER, nm | Heat treatment temperature, ° C. |
|---|---|---|---|---|
| Example 3 | 1.5 | rectangular | 1.5 | 130 |
| Example 25 | 2 | rectangular | 3.5 | 150 |
| Example 26 | 1.5 | rectangular | 2.5 | 130 |
| Example 27 | 1 | rectangular | 1.5 | 120 |
| Example 28 | 1.5 | rectangular | 1.5 | 120 |
| Example 29 | 1.5 | rectangular | 1.5 | 120 |
| Comparative Example 14 | 6 | rounded top | 4.5 | 160 |
| Comparative Example 15 | 1 | constricted | 2.5 | 110 |

While the temperature of post-development heat treatment which is effective for improving LER in the resist composition of Example 3 is 130° C., the heat treatment temperature which caused an undesired pattern size change. This result is the same as Comparative Example 13 lacking the high-boiling solvent.

Examples 30-36 and Comparative Example 16

Chemically amplified negative resist compositions were prepared in accordance with the formulation of Table 15, using solvent mixtures within the scope of the invention. The resulting patterns were evaluated for resolution and profile.

Pattern formation was carried out as in Example 1 by spin coating the resist solution onto a mask blank. Post-development heat treatment was performed at 130° C. for 4 minutes.

Table 16 reports the test results of resolution, profile (cross-sectional shape), LER, and coating property.

TABLE 15

| Components, pbw | Example | | | | | | | Comparative Example 16 |
|---|---|---|---|---|---|---|---|---|
| | 30 | 31 | 32 | 33 | 34 | 35 | 36 | |
| Polymer-2 | 80 | 80 | 80 | 80 | 80 | 80 | 80 | 80 |
| PAG-1 | 8 | 8 | 8 | 8 | 8 | 8 | 8 | 8 |
| PAG-2 | 2 | 2 | 2 | 2 | 2 | 2 | 2 | 2 |
| Crosslinker A | 8.2 | 8.2 | 8.2 | 8.2 | 8.2 | 8.2 | 8.2 | 8.2 |
| PGMEA | 1400 | 1400 | 1400 | 1400 | 1400 | 1400 | 1400 | 1400 |
| EL | 600 | 600 | 600 | 600 | 600 | 600 | 600 | 600 |
| γ-butyrolactone | 180 | — | — | — | — | — | — | — |
| tert-butyl acetoacetate | — | 180 | — | — | — | — | — | — |
| dipropylene glycol methyl ether acetate | — | — | 180 | — | — | — | — | — |
| dipropylene glycol butyl ether | — | — | — | 180 | — | — | — | — |
| tripropylene glycol butyl ether | — | — | — | — | 180 | — | — | — |
| ethylene carbonate | — | — | — | — | — | 180 | — | — |
| propylene carbonate | — | — | — | — | — | — | 180 | — |
| Surfactant A | 0.07 | 0.07 | 0.07 | 0.07 | 0.07 | 0.07 | 0.07 | 0.07 |
| N-containing compound A | 0.33 | 0.33 | 0.33 | 0.33 | 0.33 | 0.33 | 0.33 | 0.33 |

TABLE 16

|  | Resolution, nm | Profile | LER, nm | Film thickness range, nm |
|---|---|---|---|---|
| Example 30 | 50 | rectangular | 2.5 | 4 |
| Example 31 | 50 | rectangular | 2.5 | 4 |
| Example 32 | 50 | rectangular | 1.5 | 3 |
| Example 33 | 50 | rectangular | 1.5 | 3 |
| Example 34 | 50 | rectangular | 1.5 | 3 |
| Example 35 | 50 | rectangular | 2.5 | 4 |
| Example 36 | 50 | rectangular | 2.5 | 4 |
| Comparative Example 16 | 50 | rectangular | 5 | 6 |

The above results demonstrate that like the positive resist compositions, chemically amplified negative resist compositions when processed by the inventive process attain effective coating and a LER improvement of 0.5 nm due to post-development heat treatment. In Comparative Example 16 lacking the high-boiling solvent, the post-development heat treatment was not effective, that is, the LER remained unchanged from that in the absence of heat treatment.

Experiment
Quantitative Determination of Residual Solvent in Resist Film

The amount of solvents remaining in a resist film after prebaking was measured by the following procedure.

A resist composition having the formulation shown in Table 17 was coated onto a surface of a blank substrate and prebaked at 90° C. for 10 minutes to form a test film of 150 nm thick. The film on the surface was dissolved in acetone. The acetone was concentrated to 2 mL using nitrogen gas. After addition of cyclopentanone as the internal standard, the concentrate was analyzed by gas chromatography (GC). The measured value corresponds to the amount of solvent per blank substrate surface.

The amounts of solvents in the film as analyzed are reported in Table 18.

TABLE 17

|  | Experiment | | | | Comparative Experiment |
|---|---|---|---|---|---|
| Components, pbw | 1 | 2 | 3 | 4 | 1 |
| Composition | Example 3 | Example 26 | Example 27 | Example 28 | Comparative Example 2 |
| Polymer-2 | 80 | 80 | 80 | 80 | 80 |
| PAG-1 | 6 | 6 | 6 | 6 | 6 |
| PAG-2 | 2 | 2 | 2 | 2 | 2 |
| PGMEA | 1400 | 1400 | 1400 | 1400 | 1400 |
| EL | 600 | 600 | 600 | 600 | 600 |
| dipropylene glycol methyl ether acetate | 160 | 80 | 240 | 320 | — |
| Surfactant A | 0.07 | 0.07 | 0.07 | 0.07 | 0.07 |
| N-containing compound A | 0.3 | 0.3 | 0.3 | 0.3 | 0.3 |
| N-containing compound B | 0.3 | 0.3 | 0.3 | 0.3 | 0.3 |

TABLE 18

|  | PGMEA | EL | Dipropylene glycol methyl ether acetate |
|---|---|---|---|
| Example 3 | <1 μg | <1 μg | 26 μg |
| Example 26 | <1 μg | <1 μg | 13 μg |
| Example 27 | <1 μg | <1 μg | 51 μg |
| Example 28 | <1 μg | <1 μg | 96 μg |
| Comparative Example 2 | <1 μg | <1 μg | <1 μg |

As seen from the experimental results, the benefits of the invention capable of forming resist films featuring high in-plane uniformity and improved LER due to post-development heat treatment are correlated to the amount of residual high-boiling solvent.

Japanese Patent Application No. 2009-093719 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A process for forming a pattern, consisting essentially of the steps of coating a chemically amplified resist composition on a processable substrate, prebaking the coating to remove any excess solvent therein to form a resist film, exposing patternwise the resist film to high-energy radiation, optionally post-exposure baking, developing the exposed resist film with a developer, and heat treating to form a resist pattern that has a reduced LER compared with a resist pattern that is not subjected to post-development heat treatment, wherein the post-development heat treating step is at a temperature which is equal to or higher than the temperatures of the prebaking and post-exposure baking steps and a change of pattern line width by the heat treatment is less than 10%, said chemically amplified resist composition comprising a base resin, an acid generator, and a solvent, wherein the resist film of the composition changes its solubility in the developer under the action of an acid generated by the acid generator upon exposure to high-energy radiation, the solvent is present in a total amount of 1,400 to 5,000 parts by weight per 100 parts by weight of the base resin, the solvent comprises propylene glycol monomethyl ether acetate (PGMEA) and ethyl lactate which are present in a total amount of at least 60% by weight of the total solvent weight, the solvent further comprises at least one solvent selected from the group consisting of γ-butyrolactone, alkyl acetoacetate, dipropylene glycol methyl ether acetate, dipropylene glycol butyl ether, tripropylene glycol butyl ether, ethylene carbonate, and propylene carbonate, in a proportion of 0.2% to 20% by weight of the total solvent weight.

2. The process of claim 1 wherein a weight proportion of PGMEA relative to the total solvent weight is higher than a weight proportion of any other solvent relative to the total solvent weight, and a weight proportion of ethyl lactate is 10% to 40% by weight of the total solvent weight.

3. The process of claim 1, wherein the solvent further comprises propylene glycol monomethyl ether in an amount of 10 to 40% by weight of the total solvent weight.

4. The process for forming a pattern of claim 1, wherein said chemically amplified resist composition comprises:
- (A-1) a base resin having acid labile group-protected acidic functional groups which is alkali insoluble or substantially alkali insoluble, but becomes alkali soluble when the acid labile groups are eliminated,
- (B) the acid generator, and
- (C) a nitrogen-containing compound serving as a base, said resist composition being positive working.

5. A process for forming a pattern, wherein said chemically amplified resist composition comprises:
- (A-2) a base resin which is alkali soluble, but becomes alkali insoluble in the presence of an acid catalyst and/or a combination of a crosslinker and a base resin which is alkali soluble, but becomes alkali insoluble through reaction with the crosslinker in the presence of an acid catalyst,
- (B) the acid generator, and
- (C) a nitrogen-containing compound serving as a base, said resist composition being negative working.

6. The process of claim 1 wherein the resist film resulting from the film forming step has a thickness of 10 nm to 150 nm.

7. The process of claim 6 wherein the resist film has a thickness of 10 nm to 100 nm.

8. The process of claim 1 wherein the resist pattern resulting from the developing step has a minimum line width of up to 50 nm.

9. The process of claim 1 wherein the processable substrate is a photomask blank.

10. The process of claim 1 wherein the post-development heat treating step is at a temperature of 90 to 190° C.

11. The process of claim 1 wherein the proportion of at least one solvent selected from the group consisting of $\gamma$-butyrolactone, alkyl acetoacetate, dipropylene glycol methyl ether acetate, dipropylene glycol butyl ether, tripropylene glycol butyl ether, ethylene carbonate and propylene carbonate is 3.8% to 20% by weight of the total solvent weight.

* * * * *